(12) United States Patent
Rabe et al.

(10) Patent No.: US 8,908,730 B2
(45) Date of Patent: Dec. 9, 2014

(54) SHARED THRESHOLD/UNDERSHOOT LASER OUTPUT DRIVER

(75) Inventors: Cameron C. Rabe, Inver Grove Heights, MN (US); Jason P. Brenden, Woodbury, MN (US)

(73) Assignee: LSI Corporation, San Jose, CA (US)

( * ) Notice: Subject to any disclaimer, the term of this patent is extended or adjusted under 35 U.S.C. 154(b) by 294 days.

(21) Appl. No.: 13/564,009

(22) Filed: Aug. 1, 2012

(65) Prior Publication Data

US 2014/0036945 A1    Feb. 6, 2014

(51) Int. Cl.
*H01S 3/00* (2006.01)

(52) U.S. Cl.
USPC ............... 372/38.07; 372/38.01; 372/38.02

(58) Field of Classification Search
USPC ................... 372/38.01, 38.02, 38.07
See application file for complete search history.

(56) References Cited

U.S. PATENT DOCUMENTS

| | | | |
|---|---|---|---|
| 4,524,925 A | 6/1985 | Haddock | |
| 5,625,615 A | 4/1997 | Dente et al. | |
| 5,954,820 A | 9/1999 | Hetzler | |
| 6,141,312 A | 10/2000 | Masters et al. | |
| 2003/0030873 A1* | 2/2003 | Hietala et al. | ............... 359/181 |
| 2004/0095853 A1* | 5/2004 | Masui et al. | ............... 369/13.24 |
| 2006/0261990 A1 | 11/2006 | Matoba | |
| 2007/0063340 A1 | 3/2007 | Owyang et al. | |
| 2008/0079620 A1 | 4/2008 | Miho | |
| 2009/0020868 A1 | 1/2009 | Gasparik et al. | |
| 2009/0310458 A1 | 12/2009 | Nishimura et al. | |
| 2011/0075525 A1 | 3/2011 | Kimura | |

* cited by examiner

*Primary Examiner* — Yuanda Zhang
(74) *Attorney, Agent, or Firm* — Hamilton DeSanctis & Cha

(57) ABSTRACT

A laser driver apparatus, system, and method include a single laser driver. One or more threshold levels and one or more undershoot levels can be digitally combined into a single output with respect to the single laser driver to reduce the output capacitance of the single laser driver and minimize circuit power, resulting in a faster and higher fidelity signal thereof. A decoder (e.g., thermometer decoding) can also be provided, wherein the threshold level(s) and the undershoot level(s) are thermometer decoded via the decoder.

6 Claims, 6 Drawing Sheets

FIG. 6

| | E9 US(LSB) | E8 AO(MSB) | E7 AO | E6 AO | E5 AO | E4 AO | E3 AO | E2 AO US(MSB) | E1 AO(LSB) |
|---|---|---|---|---|---|---|---|---|---|
| IUndershoot setting | 15 | | | | | | | 16 | |
| Emitter Number | E9 | E8 | E7 | E6 | E5 | E4 | E3 | E2 | E1 |
| IThreshold − IUndershoot (Always On Setting) | | 16 | 16 | 16 | 16 | 16 | 16 | 16 | 15 |
| Examples | | | | | | | | | |
| IThreshold = 127, IUndershoot = 63, (IThreshold − IUndershoot = 64) | 15 | 16 | 16 | 16 | Off | Off | Off | Off | Off |
| IThreshold = 127, IUndershoot = 36, (IThreshold − IUndershoot = 91) | 4 | Off | Off | 16 | 16 | Off | Off | Off | 11 |
| IThreshold = 127, IUndershoot = 110, (IThreshold − IUndershoot = 17) | 14 | 16 | 16 | 16 | 16 | 16 | 16 | Off | 1 |
| IThreshold = 80, IUndershoot = 34, (IThreshold − IUndershoot = 46) | 2 | 16 | 16 | Off | Off | Off | Off | 16 | 14 |

130

SHARED THRESHOLD/UNDERSHOOT LASER OUTPUT DRIVER

TECHNICAL FIELD

Embodiments are generally related to hard disk drives and tape storage peripherals such as, for example, controllers, preamplifiers, interfaces, and power management. Embodiments are also related to laser driver circuits and DAC (Digital-to-Analog Converter) components and related techniques.

BACKGROUND OF THE INVENTION

Laser drivers find use in the context of hard disk drives and tape storage peripherals, particularly optical disk drives. In general, when information is recorded onto an optical disk using laser light, each recording mark is formed in a disk recording film by a laser pulse train thereby to perform information recording. The laser pulse train used at this time is called "recording strategy".

Information about the recording strategy comprises power levels (hereinafter defined as "power levels") of laser pulses and their pulse light-emitting timings (hereinafter defined as "pulse timings"). It is necessary to optimize these parameters according to recording conditions such as the type of optical disk, the length of each recording mark and the length of space defined therebetween, a recoding speed, etc.

In an optical disk apparatus, a laser is driven using a laser drive circuit (hereinafter described as "laser driver") mounted onto a pickup based on recording strategy information thereby to generate laser pulses.

In general, laser driver requirements for disk drives require two different current levels to operate properly. The first is a pulse or active level that turns the laser sufficiently on to reduce the coercivity of the magnetic media (through heating) to a point where writers can flip the magnetic polarity. The second is a threshold level, which is lower than the pulse level and just below the lasing point where the media is not heated, but high enough for a fast transition back to the pulse lasing level.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved laser driver or laser output driver.

It is another aspect of the disclosed embodiments to provide for a laser driver apparatus that utilizes a single laser driver.

It is a further aspect of the disclosed embodiments to provide for a laser driver apparatus, system, and method that utilizes threshold and undershoot levels in a digitally combined output to reduce the output capacitance of the laser driver and minimize power consumption.

The aforementioned aspects and other objectives and advantages can now be achieved as described herein. A laser driver apparatus, methods, and systems are disclosed, which includes a single laser driver. One or more threshold levels and one or more undershoot levels can be digitally combined into a single output with respect to the single laser driver to reduce the output capacitance of the single laser driver and minimize circuit power, resulting in a faster and higher fidelity signal thereof. A decoder (e.g., thermometer decoding) can also be provided, wherein the threshold level(s) and the undershoot level(s) are thermometer decoded via the decoder.

A number of embodiments, preferred and alternative are disclosed herein. For example, in one embodiment, a laser driver apparatus can be configured, which includes, for example, a single laser driver, and one or more threshold levels and one or more undershoot levels. The threshold and undershoot levels can be digitally combined into a single output with respect to the single laser driver to reduce an output capacitance of the single laser driver and minimize the circuit power of the single laser driver, resulting in a faster and higher fidelity signal thereof.

In another embodiment, a decoder can be provided wherein the threshold and undershoot levels are thermometer decoded via the decoder with respect to the single laser driver. In another embodiment, the single laser driver can include one or more digital-to-analog converters. In another embodiment, the aforementioned decoder can communicate electronically with the e digital-to-analog converters.

In still another embodiment, thermometer decoding of the threshold and the undershot levels via the decoder can permit usage of the single laser driver, if the threshold and undershoot levels are digitally combined such that at least one least significant bit of at least one digital-to-analog converter among the plurality of digital-to-analog converters maps to a same bit driver as the most significant bit (or bits) of at least one other digital-to-analog converter among the plurality of digital-to-analog converters.

In another embodiment, the decoder can communicate electronically with a first digital-to-analog converter and a second digital-to-analog converter. In yet another embodiment, a value of the threshold level(s) minus a value of the undershoot level(s) is greater than zero; step sizes associated with the threshold level(s) and the undershoot level(s) constitute at least a multiple of two of one another; and the threshold level(s) and the undershoot level(s) are thermometer decoded in a shared portion thereof.

In still another embodiment, a laser driver system can include a single laser driver, one or more threshold levels and one or more undershoot levels, wherein the threshold and undershoot level(s) are digitally combined into a single output with respect to the single laser driver to reduce an output capacitance of the single laser driver and minimize the circuit power of the single laser driver resulting in a faster and higher fidelity signal thereof, and a decoder, wherein the threshold level(s) and the undershoot level(s) are thermometer decoded via the decoder with respect to the single laser driver.

In yet another embodiment, a method for minimizing power usage in a laser driver can be implemented. Such a method can include, for example, the steps of generating at least one threshold level and at least one undershoot level with respect to a single laser driver, and digitally combining the at least one threshold level and the at least one undershoot level into a single output with respect to the single laser driver to reduce an output capacitance of the single laser driver and minimize a circuit power of the single laser driver resulting in a faster and higher fidelity signal thereof.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 6 illustrates an example table where Ithreshold and Iundershoot are both 7-bit bit DACs with equal step sizes and the 3 most significant bits are thermometer decoded, in accordance with the disclosed embodiments.

DETAILED DESCRIPTION

The particular values and configurations discussed in these non-limiting examples can be varied and are cited merely to illustrate at least one embodiment and are not intended to limit the scope thereof.

The disclosed embodiments relate to systems, devices, and techniques for digitally combining undershoot (e.g., Iundershoot) and threshold (e.g., Ithreshold) DAC (Digital-to-Analog Converter) functions of a laser driver into a single DAC output creating a minimal output capacitance, low power, and small die area solution. Normally these functions would be accomplished with two individual drivers that almost doubles the area and capacitance and constructed in such a manner that the undershoot laser current level is accomplished by stealing from the threshold current that is wasteful of power. As will be explained in greater detail herein, by thermometer decoding the threshold and undershoot DACS, a single driver can be used if the threshold and undershoot signals are digitally combined such that the LSB (Least Significant Bit) of one DAC maps to the same bit driver as the MSB (Most Significant Bit) of the other DAC.

In appreciating the novelty of the disclosed embodiments, it is important to appreciate that laser driver requirements for disk drives require two different current levels to operate properly. The first current level is a pulse or active level that turns the laser sufficiently on to reduce the coercivity of the magnetic media (e.g., through heating) to a point where writers can flip the magnetic polarity. The second current level is a threshold level, which is lower than the pulse level and just below the lasing point where the media is not heated, but high enough for fast turn on back to the pulse lasing level.

For pulse mode operations, the laser is toggled from threshold to pulse level and back again very quickly. By using overdrive, one can overcome high frequency losses in the interconnect and charge capacitances in the system. This function can be termed as overshoot when going from a threshold to a pulse value and termed as undershoot when returning from a pulse to threshold.

Figure 1:
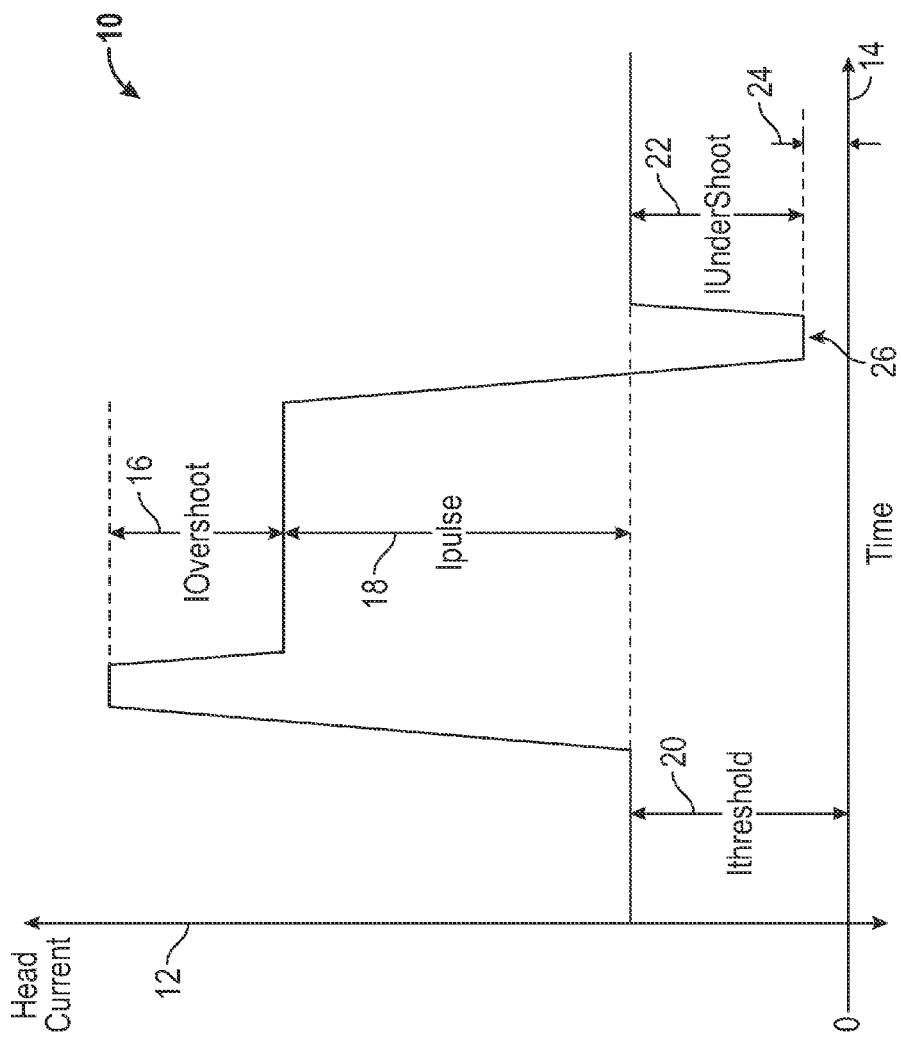
FIG. 1 illustrates a graph demonstrating laser driver waveform measurement definitions, in accordance with the disclosed embodiments.

FIG. 1 illustrates a graph 10 demonstrating laser driver waveform measurement definitions, in accordance with the disclosed embodiments. Graph 10 includes a x-axis 14 tracking data indicative of time and a y-axis 12 tracking data indicative of head current values. Graph 10 indicates a threshold 20 with respect to a pulse 18 (e.g., pulse values) and an overshoot 16 (e.g., overshot data). An undershoot 22 is also shown in graph 10 along with a line 26, which indicates that the absolute current level is not less than 0 mA. A gap 24 shown in graph 10 indicates a value or values indicative of threshold data minus undershoot data.

Figure 2:
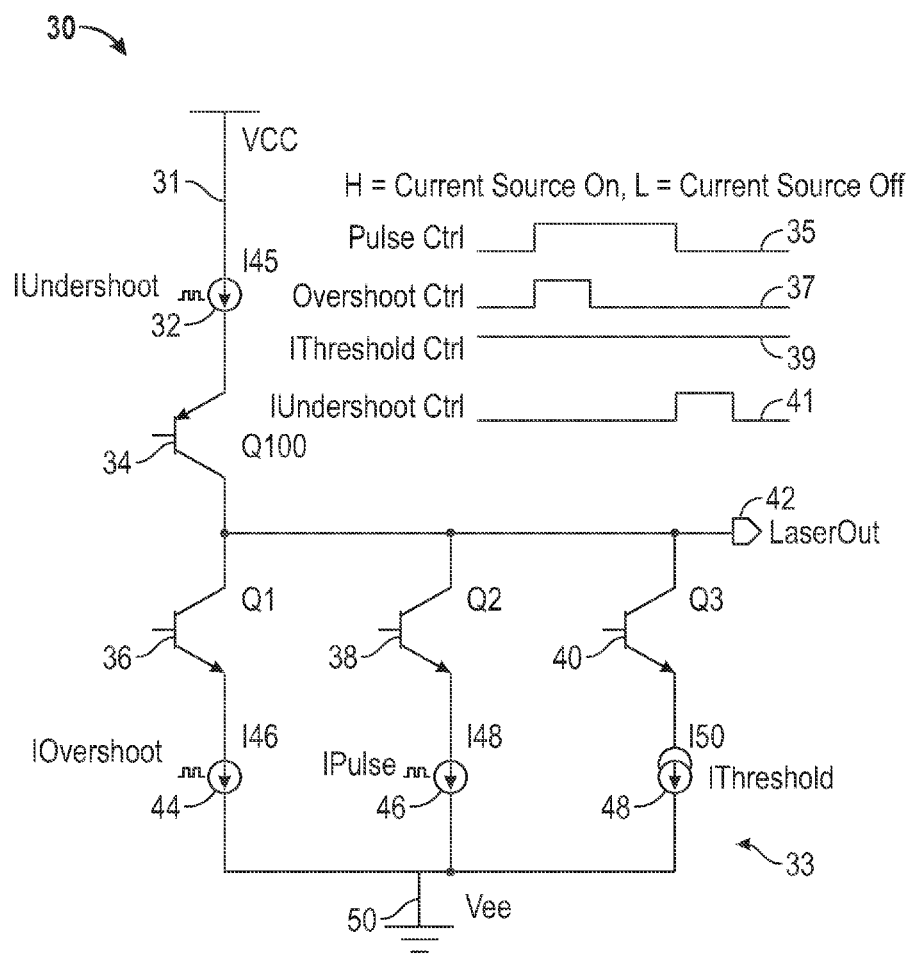
FIG. 2 illustrates a schematic diagram of a circuit architecture not chosen, in order to explain how the undershoot power is wasted and extra capacitance is added.

FIG. 2 illustrates a schematic diagram 30 of a circuit 33 that includes a transistor 34 electrically connected to a current source 32, which in turn is electrically connected to a voltage source 31 (e.g., Vcc). The schematic diagram 30 and circuit 33 shown in FIG. 2 represents a circuit architecture not chosen, in order to explain how the undershoot power is wasted and extra capacitance is added. The transistor 34 is also connected to a transistor 36, which in turn is electrically connected to a current source 44, which is connected to ground 50. Transistor 36 is thus in electrical series with current source 44. Transistor 36 and current source 44 are in parallel with transistor 38 and current source 46 and transistor 40 and current source 48. That is, current sources 46 and 48 are also connected to ground 50 and transistors 38 and 40 are connected to transistor 36.

A laser output 42 can thus be determined at the junction of transistors 34, 36, 38, and 40. A pulse control signal 35, an overshoot control signal 37, a threshold control signal 39, and an undershoot control signal 41 is also shown in the schematic diagram 30 shown in FIG. 2 with respect to the circuit 33. These signals 35, 37, 39, 41 respectively relate to current source 46 (e.g., IPulse), current source 44 (e.g., IOvershoot), current source 48 (e.g., IThreshold), and current source 32 (e.g., IUndershoot). In FIG. 2, the undershoot (e.g., Iundershoot) subtracts from the threshold (e.g., Ithreshold) such that power is wasted (i.e., not going to laser output 42) and the driver adds extra capacitance.

Figure 3:
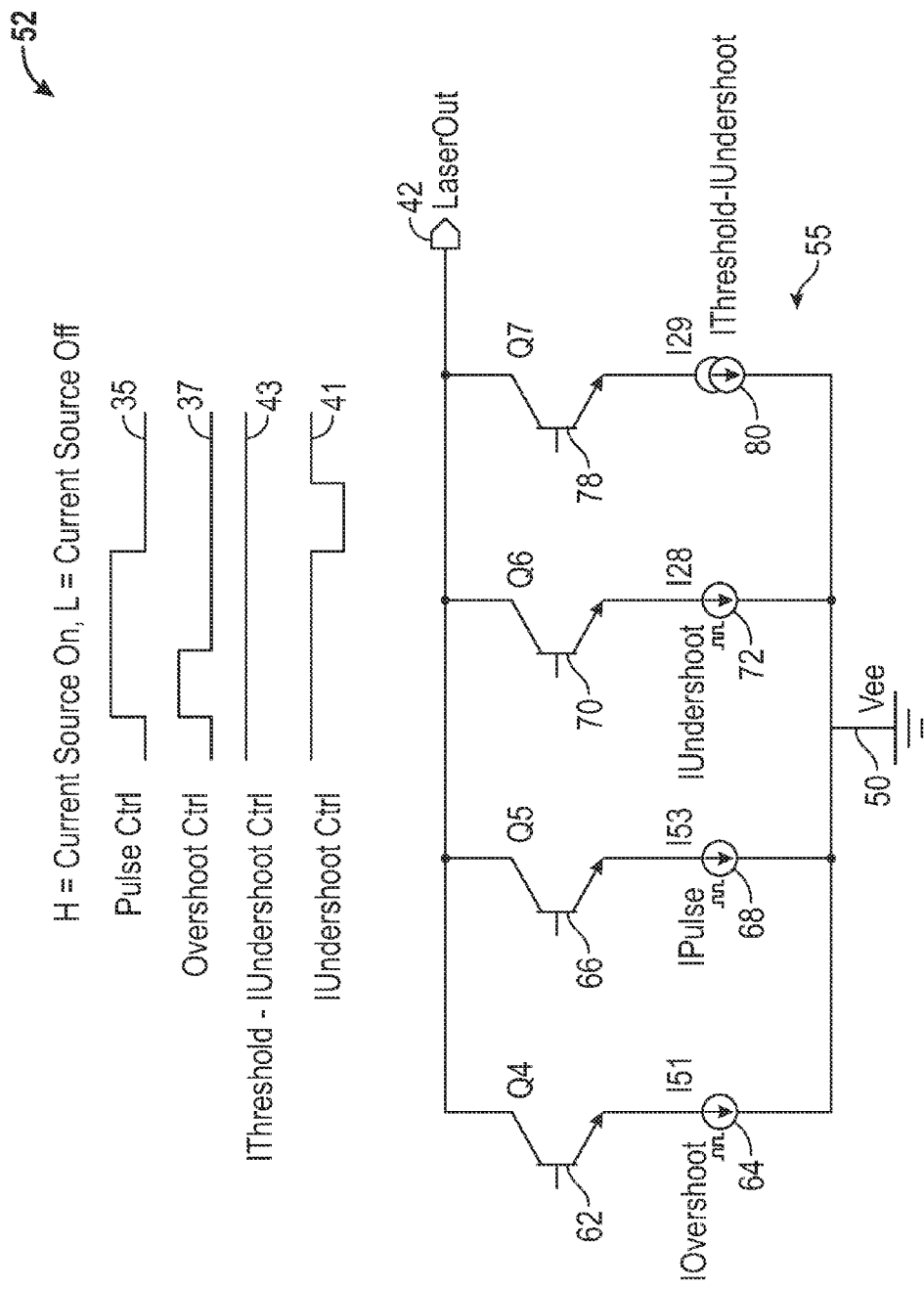
FIG. 3 illustrates a schematic diagram of a circuit architecture not chosen, in order to demonstrate a more efficient use of power, while indicating the addition of extra capacitance.

FIG. 3 illustrates a schematic diagram 52 of a circuit 55 that includes a group of transistors 62, 66, 70, 78 with respect to a group of current sources 64, 68, 72, and 80. Note that in FIG. 3, transistors 62, 66, 70, and 78 are also respectively labeled as Q4, Q5, Q6, and Q7. Similarly, current sources 64, 68, 72, and 80 are also respectively labeled as IOvershoot, IPulse, IUndershoot, and IThreshold−IUndershoot. The schematic diagram 52 and circuit 55 shown in FIG. 3 represents a circuit architecture not chosen, in order to demonstrate a more efficient use of power, while indicating the addition of extra capacitance. In the configuration shown in FIG. 3, transistor 62 is electrically connected to current source 64 (i.e., IOvershoot), and transistor 66 is electrically connected to current source 68 (i.e., IPulse). Transistor 70 is electrically connected to current source 72 (i.e., IUndershoot) and transistor 78 is electrically connected to current driver(s) 80 (i.e., IThreshold−IUndershoot). Current drivers 64, 68, 72, and 80 are connected to ground 50 and transistors 62, 66, 70, and 78 are connected to one another.

The laser output 42 can be derived from the junction of transistors 62, 66, 70, and 78. The pulse control signal 35 is associated with current source 68 (i.e., IPulse) and the overshoot control signal 37 is associated with current source 64 (i.e., IOvershoot). Note that the signal 43 shown in FIG. 3 represents a control signal or pulse representative of the threshold minus the undershoot unlike the signal 39 depicted in FIG. 2, which is representative of only a threshold control signal. Signal 43 of FIG. 3 is associated with current source(s) 80 (i.e., IThreshold minus IUndershoot). The undershoot control signal 41 is associated with the current source 72. In the configuration of FIG. 3, the undershoot no longer subtracts from the threshold so a more efficient use of power can be implemented and the transistor 78 (i.e., driver) adds extra capacitance.

Figure 4:
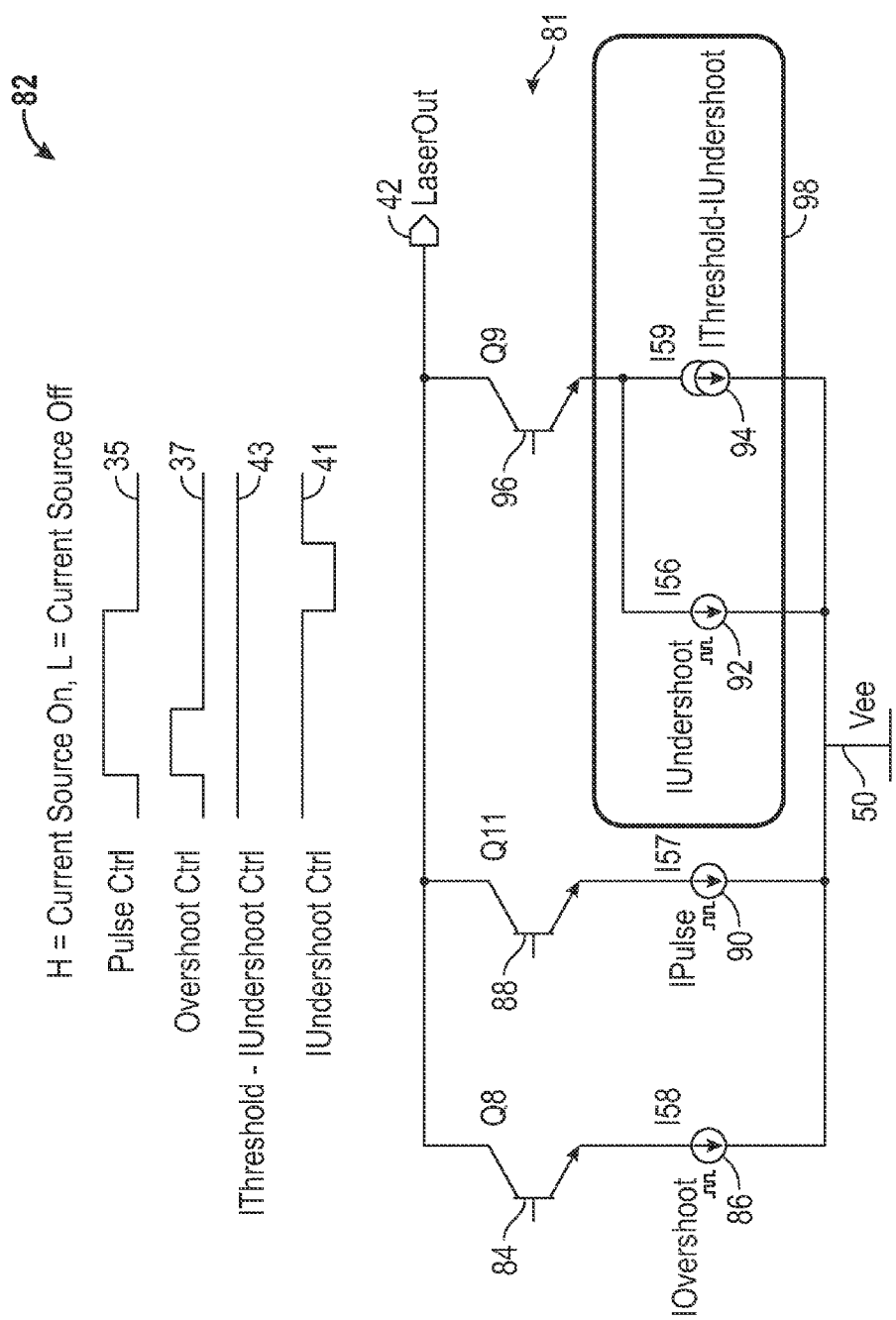
FIG. 4 illustrates a schematic diagram of a circuit, in accordance with a preferred embodiment.

FIG. 4 illustrates a schematic diagram 82 of a circuit 81, in accordance with a preferred embodiment. In circuit 81 shown in FIG. 4, three transistors 84, 88, and 96 are shown, wherein transistor 84 is electrically connected to current source 86 and transistor 88 is electrically connected to current source 90. Transistor 96 is electrically connected to current sources 92 and 94. Current sources 86, 90, 92, and 94 are each connected to ground 50. In the configuration of FIG. 4, current functions 98 (i.e., both current sources 92 and 94) are combined into a single DAC such that the output devices (e.g., current sources 92 and 94) are shared and the two separate functions are digitally controlled. Note that in FIG. 4, the pulse control signal 35 is associated with current source 90 (i.e., IPulse) and the overshoot control signal 37 is associated with current source 86 (i.e., IOvershoot). Additionally, the control signal 43 (IThreshold−IUndershoot) is associated with current driver(s) 94 and the undershoot control signal 41 is associated with the current driver 92 (i.e., IUndershoot). In the circuit 81, the undershoot no longer subtracts from the threshold, so a more efficient use of power can be implemented. Additionally, driver or transistor 96 is shared to reduce output capacitance.

Figure 5:
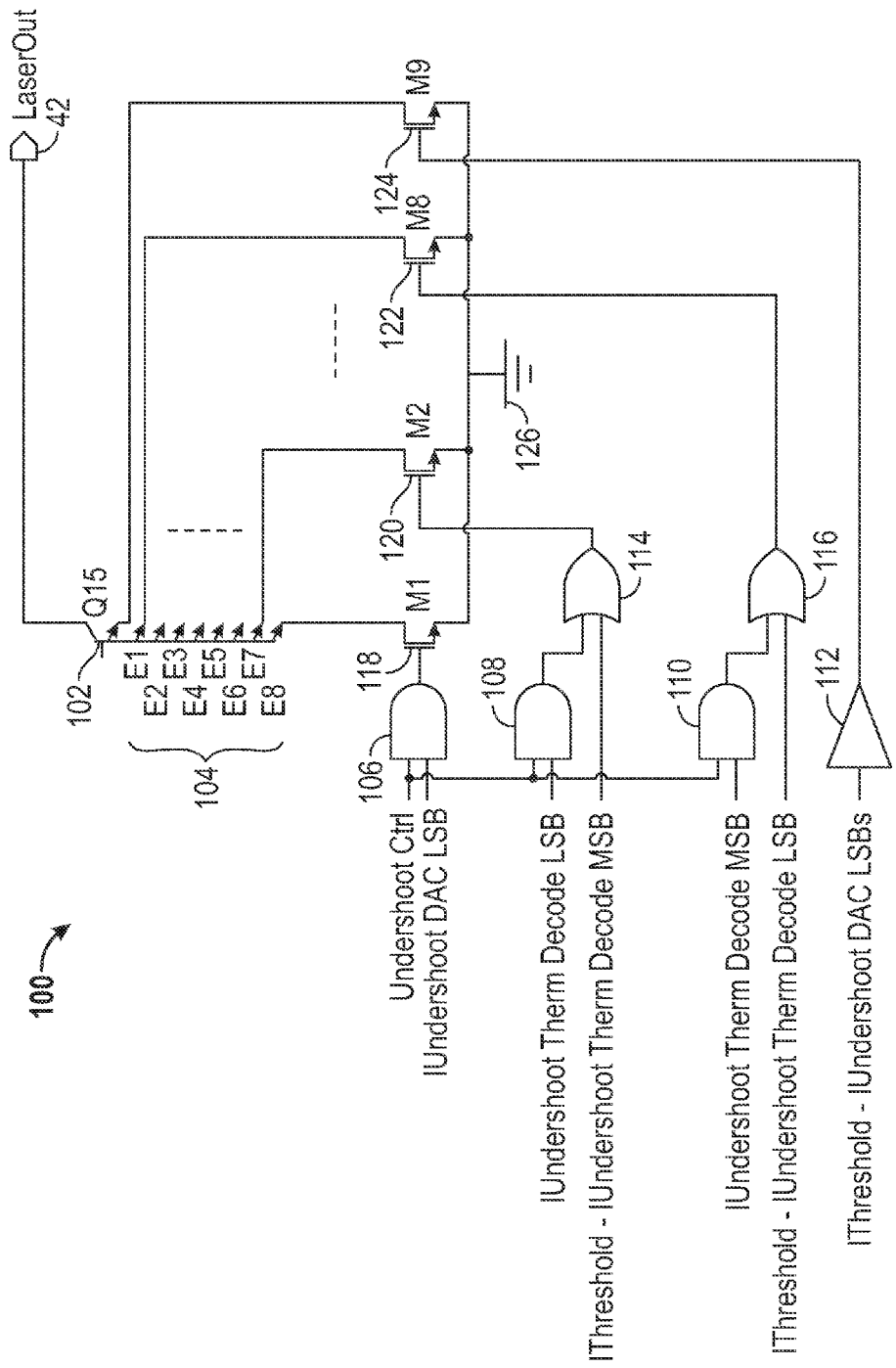
FIG. 5 illustrates a schematic diagram of a shared undershoot/threshold—undershot circuit, in accordance with an alternative embodiment.

FIG. 5 illustrates a schematic diagram of a shared undershoot/threshold−undershoot circuit 100, in accordance with an alternative embodiment. In general, circuit 100 includes a number of transistors 102, 118, 120, 122, and 124. Transistors 118, 120, 122, and 124 are connected to ground. The laser output 42 can be taken from transistor 102. Transistors 122, 124 and 118, 120 (and other transistors or drivers) can also be connected to an emitter output of transistor 102. Additionally, AND gates 106, 108, and 110 are provided, wherein the output of AND gate 106 is fed as input to transistor 118 and the output of AND gate 108 is fed as an input to OR gate 114. Additionally, an output of AND gate 110 can be fed as an input to OR gate 116. Output from OR gate 114 can be fed as input to transistor 120.

Additionally, output from OR gate 116 can be fed as input to transistor 122. An amplifier 112 can also be provided as a part of circuit 100. Output from buffer 112 is fed as input to transistor 124. Inputs to AND gate 106 include an undershoot control signal and an undershoot DAC LSB (one or more LSBs). An undershoot thermometer decode LSB can be provided as input to the AND gate 108 along with the undershoot control signal. A (threshold minus undershoot) thermometer decode MSB can be fed as input to the OR gate 114 along with the output of the AND gate 108. Additionally, the undershoot control signal (which is also input to AND gate 108 and AND gate 106) can be fed as input to the AND gate 110 along with a undershoot thermometer decode MSB. A (threshold minus undershoot) thermometer decode LSB can be input to the OR gate 116 along with the output of the AND gate 110. Finally, a (threshold minus undershoot) DAC LSB (nor or more such LSBs) can be provided as input to the buffer 112.

Based on the foregoing, it can be appreciated that four current levels can be generated in a number of ways (e.g., see FIGS. 2 and 3). There is an optimal way (the point of the disclosed embodiments), however, that requires the least amount of power, and adds the minimum amount of capacitance to the output pin as shown in the schematic diagram 82 of FIG. 4. Also note that only the bottom half of the differential driver circuit is shown. A complementary PNP top half is not shown for simplicity.

If the following constraints are met, a digital solution exists for combining the threshold and undershoot output drivers reducing die area and output capacitance (see FIG. 5):
1) Ithreshold−Iundershoot>0
2) Ithreshold and Iundershoot step sizes must be a multiple of 2 of each other
3) Ithreshold and Iundershoot must be thermometer decoded in the portion that is shared FIG. 6 illustrates an example table where Ithreshold and Iundershoot are both 7-bit DACs with equal step sizes and the 3 most significant bits are thermometer decoded, in accordance with the disclosed embodiments. In FIG. 6, each column represents a bipolar emitter. The leftmost column is the 4 non-thermometer decoded IUndershoot DAC bits. The rightmost column is the non-thermometer decoded Ithreshold−Iundershoot DAC bits. The center 7 columns are the shared thermometer decoded bits where the MSB of the undershoot is on the right side and the MSB of the Ithreshold−Iundershoot DAC is on the left side.

Four different Ithreshold, Iundershoot examples are listed. Values are indicated in FIG. 6 for the Ithreshold−Iundershoot DAC drivers that are on. Values are also indicated for the Ithreshold DAC that turns on when the Iundershoot Ctrl turns on (e.g., as in FIG. 4). For a complete table of all Ithreshold, Iundershoot settings, one will find that there are no cases where a driver would need to be on for both Iundershoot and Ithreshold−Iundershoot (i.e., this range of values never overlaps). In this manner, a driver with minimized capacitance, area, and power can be implemented by sharing as much driver and DAC circuitry as possible while requiring minimal digital decode.

Based on the foregoing, it can be appreciated that a number of embodiments, preferred and alternative, are disclosed herein. For example, in one embodiment, a laser driver apparatus can be configured, which includes, for example, a single laser driver, and one or more threshold levels and one or more undershoot levels. The threshold and undershoot levels can be digitally combined into a single output with respect to the single laser driver to reduce an output capacitance of the single laser driver and minimize the circuit power of the single laser driver, resulting in a faster and higher fidelity signal thereof.

In another embodiment, a decoder can be provided wherein the threshold and undershoot levels are thermometer decoded via the decoder with respect to the single laser driver. In another embodiment, the single laser driver can include one or more digital-to-analog converters. In another embodiment, the aforementioned decoder can communicate electronically with the digital-to-analog converters.

In still another embodiment, thermometer decoding of the threshold and the undershot levels via the decoder can permit usage of the single laser driver, if the threshold and undershoot levels are digitally combined such that at least one least significant bit of at least one digital-to-analog converter among the plurality of digital-to-analog converters maps to a same bit driver as the most significant bit (or bits) of at least one other digital-to-analog converter among the plurality of digital-to-analog converters.

In another embodiment, the decoder can communicate electronically with a first digital-to-analog converter and a second digital-to-analog converter. In yet another embodiment, a value of the threshold level(s) minus a value of the undershoot level(s) is greater than zero; step sizes associated with the threshold level(s) and the undershoot level(s) constitute at least a multiple of two of one another; and the threshold level(s) and the undershoot level(s) are thermometer decoded in a shared portion thereof.

In still another embodiment, a laser driver system can include a single laser driver, one or more threshold levels and one or more undershoot levels, wherein the threshold and undershoot level(s) are digitally combined into a single output with respect to the single laser driver to reduce an output capacitance of the single laser driver and minimize the circuit power of the single laser driver resulting in a faster and higher fidelity signal thereof, and a decoder, wherein the threshold level(s) and the undershoot level(s) are thermometer decoded via the decoder with respect to the single laser driver.

In yet another embodiment, a method for minimizing power usage in a laser driver can be implemented. Such a method can include, for example, the steps of generating at least one threshold level and at least one undershoot level with respect to a single laser driver, and digitally combining the at least one threshold level and the at least one undershoot level into a single output with respect to the single laser driver to reduce an output capacitance of the single laser driver and minimize a circuit power of the single laser driver resulting in a faster and higher fidelity signal thereof.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A laser driver apparatus, comprising:
   a single laser driver comprising a plurality of digital-to-analog converters;
   a decoder that communicates electronically with said plurality of digital-to-analog converters;
   at least one threshold level and at least one undershoot level, wherein said at least one threshold level and said at least one undershoot level are digitally combined into a single output with respect to said single laser driver to reduce an output capacitance of said single laser driver and minimize a circuit power of said single laser driver resulting in a faster and higher fidelity signal thereof; and
   wherein thermometer decoding of said at least one threshold level and said at least one undershot level via said decoder permits usage of said single laser driver if said at least one threshold level and said at least one undershoot level are digitally combined such that at least one least significant bit of at least one digital-to-analog converter among said plurality of digital-to-analog converters maps to a same bit driver as at least one most significant bit of at least one other digital-to-analog converter among said plurality of digital-to-analog converters.

2. The apparatus of claim 1, wherein said at least one threshold level and said at least one undershoot level are thermometer decoded via said decoder with respect to said single laser driver.

3. The apparatus of claim 1, wherein:
   a value of said at least one threshold level minus a value of said at least one undershoot level is greater than zero;
   step sizes associated with said at least one threshold level and said at least one undershoot level constitute at least a multiple of two of one another; and
   said at least one threshold level and said at least one undershoot level are thermometer decoded in a shared portion thereof.

4. A laser driver apparatus, comprising:
   a single laser driver comprising a plurality of digital-to-analog converters; and
   at least one threshold level and at least one undershoot level, wherein said at least one threshold level and said at least one undershoot level are digitally combined into a single output with respect to said single laser driver to reduce an output capacitance of said single laser driver and minimize a circuit power of said single laser driver resulting in a faster and higher fidelity signal thereof a decoder that communicates electronically with a first digital-to-analog converter and a second digital-to-analog converter; and
   wherein thermometer decoding of said at least one threshold level and said at least one undershot level via said decoder permits usage of said single laser driver if said at least one threshold level and said at least one undershoot level are digitally combined such that at least one least significant bit associated with said first digital-to-analog converter maps to a same bit driver associated with said second digital-to-analog converter.

5. A method for minimizing power usage in a laser driver, said method comprising:
   generating at least one threshold level and at least one undershoot level with respect to a single laser driver comprises a plurality of digital-to-analog converters;
   digitally combining said at least one threshold level and said at least one undershoot level into a single output with respect to said single laser driver to reduce an output capacitance of said single laser driver and minimize a circuit power of said single laser driver resulting in a faster and higher fidelity signal thereof;
   providing a decoder that communicates electronically with said plurality of digital-to-analog converters; and
   thermometer decoding of said at least one threshold level and said at least one undershoot level via said decoder to permit usage of said single laser driver if said at least one threshold level and said at least one undershoot level are digitally combined such that at least one least significant bit of at least one digital-to-analog converter among said plurality of digital-to-analog converters maps to a same bit driver as at least one most significant bit of at least one other digital-to-analog converter among said plurality of digital-to-analog converters.

6. The method of claim 5 thermometer decoding via a decoder said at least one threshold level and said at least one undershoot level with respect to said single laser driver.

* * * * *